US008724289B2

(12) United States Patent
Shiraiwa et al.

(10) Patent No.: US 8,724,289 B2
(45) Date of Patent: May 13, 2014

(54) SUBSTRATE TEMPERATURE ADJUSTING-FIXING DEVICE

(75) Inventors: Norio Shiraiwa, Nagano (JP); Yuichi Hata, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 256 days.

(21) Appl. No.: 13/453,001

(22) Filed: Apr. 23, 2012

(65) Prior Publication Data

US 2012/0287552 A1    Nov. 15, 2012

(30) Foreign Application Priority Data

May 9, 2011   (JP) ................................. 2011-104087

(51) Int. Cl.
*H02N 13/00*    (2006.01)

(52) U.S. Cl.
USPC ......................................................... 361/234

(58) Field of Classification Search
USPC ......................................................... 361/234
See application file for complete search history.

(56) References Cited

U.S. PATENT DOCUMENTS

| | | | |
|---|---|---|---|
| 5,625,526 A | 4/1997 | Watanabe et al. | |
| 6,256,187 B1 * | 7/2001 | Matsunaga et al. | 361/234 |
| 6,490,144 B1 * | 12/2002 | Narendrnath et al. | 361/234 |
| 6,849,938 B2 * | 2/2005 | Ito | 257/703 |
| 7,763,146 B2 * | 7/2010 | Eguchi | 156/711 |
| 2001/0019472 A1 * | 9/2001 | Kanno et al. | 361/234 |
| 2002/0075624 A1 * | 6/2002 | Wang et al. | 361/234 |
| 2003/0064225 A1 * | 4/2003 | Ohashi et al. | 428/408 |
| 2004/0071945 A1 * | 4/2004 | Ito et al. | 428/209 |
| 2005/0215073 A1 * | 9/2005 | Nakamura et al. | 438/778 |
| 2009/0095733 A1 * | 4/2009 | Komatsu | 219/521 |
| 2012/0076574 A1 * | 3/2012 | Parkhe | 403/272 |

FOREIGN PATENT DOCUMENTS

JP          7-074234          3/1995

* cited by examiner

*Primary Examiner* — Ronald W Leja
(74) *Attorney, Agent, or Firm* — IPUSA, PLLC

(57) ABSTRACT

A disclosed substrate temperature adjusting-fixing device includes an electro static chuck attracting and holding an attractable object onto a base body having a built-in electrode by applying a voltage to the electrode, a base plate fixing the electro static chuck via an adhesive layer, a power supplying portion electrically connected to the electrode, and a retaining portion holding the power supplying portion, wherein the retaining portion includes a main body and a sealing portion, the main body is fixed to the base plate and has recesses opened on an opposite side of the adhesive layer and a through hole penetrating through the main body, the power supplying portion includes an electrode pin and an electric wire, the electric wire is wired inside the adhesive layer, the through hole and the recesses to electrically connect the electrode with the electrode pin, and the sealing portion fills the recesses.

6 Claims, 12 Drawing Sheets

SUBSTRATE TEMPERATURE ADJUSTING-FIXING DEVICE

CROSS-REFERENCE TO RELATED APPLICATIONS

This patent application is based upon and claims the benefit of priority of Japanese Patent Application No. 2011-104087 filed on May 9, 2011, the entire contents of which are incorporated herein by reference.

FIELD

The present invention discussed herein is related to a substrate temperature adjusting-fixing device. More specifically, the present invention relates to a substrate temperature adjusting-fixing device including an electro static chuck for an object to be attracted which is mounted in a base body for accurately holding a substrate inside a vacuum processing chamber of a manufacturing apparatus.

BACKGROUND

An example of a manufacturing apparatus such as coating equipment (e.g., chemical vapor deposition (CVD) equipment and a physical vapor deposition (PVD) equipment) and plasma etching equipment includes a stage for accurately holding a substrate such as a silicon wafer inside a vacuum processing container. One type of the stage is a substrate temperature adjusting-fixing device including an electro static chuck.

Japanese Laid-open Patent Publication No. 07-74234 discloses one type of the substrate temperature adjusting-fixing device which attracts and holds a substrate being an object to be attracted (hereinafter, an attractable object), and controls the temperature of the attractable object to be a predetermined temperature.

SUMMARY

Accordingly, embodiments of the present invention may provide a novel and useful substrate temperature adjusting-fixing device.

According to an aspect of the embodiment, a substrate temperature adjusting-fixing device includes an electro static chuck configured to attract and hold an attractable object onto a base body of the electro static chuck having an electrode which is built in the base body by applying a voltage to the electrode; a base plate configured to fix the electro static chuck via an adhesive layer; a power supplying portion electrically connected to the electrode; and a retaining portion configured to hold the power supplying portion, wherein the retaining portion includes a retaining portion main body and a sealing portion, the retaining portion main body is fixed to the base plate, and has recesses opened on a side opposite to a side of the adhesive layer and a through hole penetrating through the retaining portion main body to the side of the adhesive layer, the power supplying portion includes an electrode pin and an electric wire, the electrode pin is fixed to an inside of the recesses, the electric wire is wired inside the adhesive layer, the through hole and the recesses to electrically connect the electrode with the electrode pin, and the sealing portion is formed by filling at least the recesses.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENTS

A description is given below, with reference to the FIG. 1 through FIG. 13 of embodiments of the present invention.

In a substrate temperature adjusting-fixing device, an electro static chuck includes electrodes and a voltage is applied to the electrodes via a power supplying portion. It is preferable for the substrate temperature adjusting-fixing device to have improved voltage endurance or durability of the power supplying portion of the substrate temperature adjusting-fixing device since the substrate temperature adjusting-fixing device is used in various ambient temperatures from a lower temperature to a higher temperature, and a high voltage may be applied that requires the improved voltage endurance or the durability of the power supplying portion. Hereinafter, an exemplary power supplying portion of the substrate temperature adjusting-fixing device is described.

Figure 1:
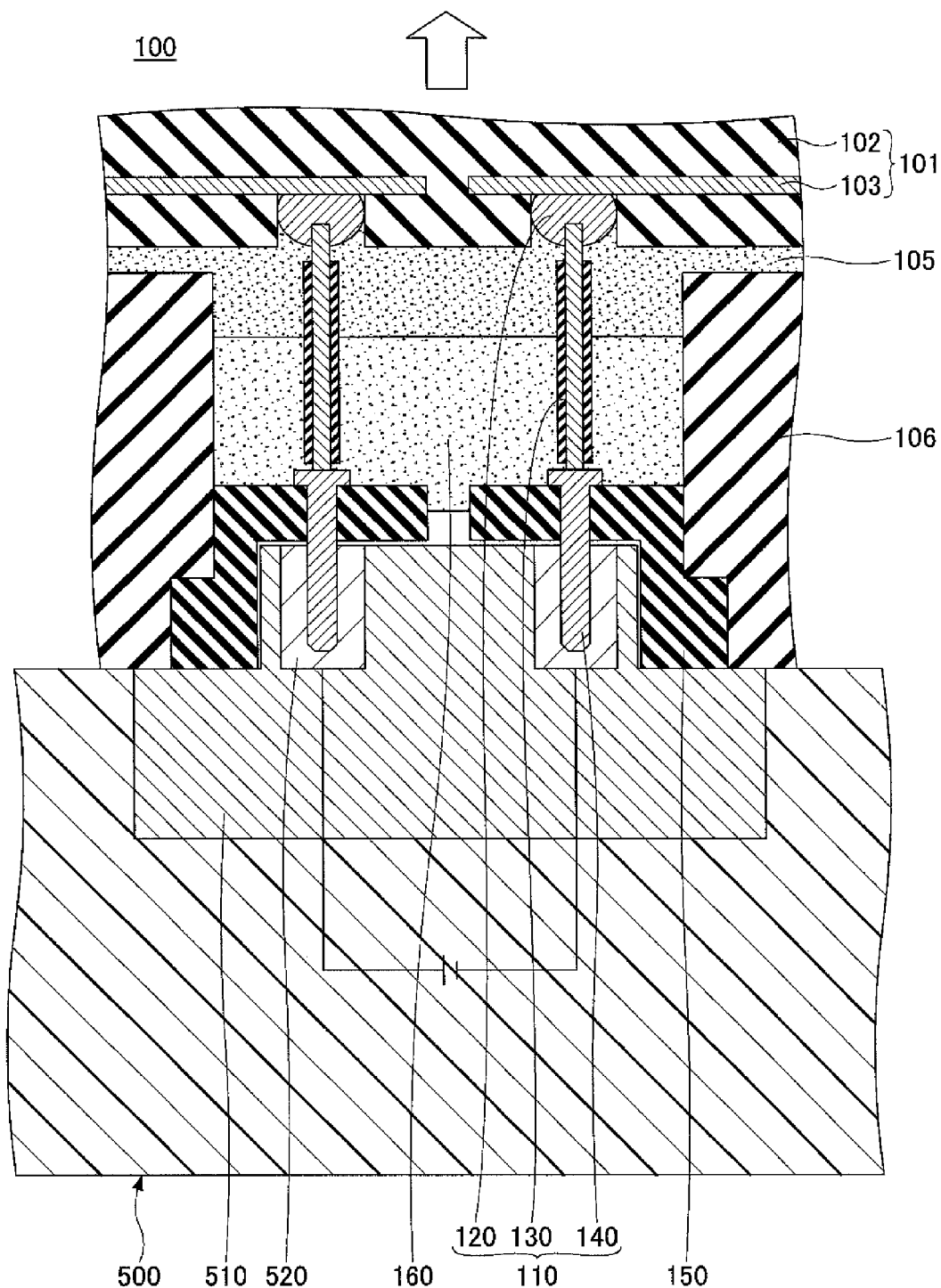
FIG. 1 is a cross-sectional view of a power supplying portion of an exemplary substrate temperature adjusting-fixing device.

FIG. 1 is a cross-sectional view of the power supplying portion of the exemplary substrate temperature adjusting-fixing device. Referring to FIG. 1, the substrate temperature adjusting-fixing device 100 includes an electro static chuck 101, an adhesive layer 105, a base plate 106, power supplying portions 110, a socket 150, and an insulating layer 160. The electro static chuck 101 is of a coulomb force type including a base body 102 and electrodes 103. The base body 102 is fixed on the base plate 106 via the adhesive layer 105 on the base plate 106. The base body 102 is made of ceramics. The base plate 106 supports the electro static chuck 101 and is made of a metal such as aluminum (Al).

The electrodes 103 are integrated in the base body 102 and are connected to a direct current (DC) power source (not illustrated) which is provided on an outside of the substrate temperature adjusting-fixing device 100 via the power supplying portion 110. The power supplying portion 110 includes a solder portion 120, an electric wire 130 and an electrode pin 140. The solders 120 connect the electrodes 103 to one ends of the electric wires 130. The other ends of the electric wires 130 are connected to one ends of the electrode pins 140. The other ends of the electrode pins 140 protrude on a lower surface side of the base plate 106 via the socket 150. The electrode pins 140 are connected to conductive portions 520 of the connectors 510 provided in a manufacturing apparatus 500. The socket 150 is installed inside a through hole formed in the base plate 106 so as to hold the electrode pins 140. The insulating layer 160 made of an insulating resin fills in between the adhesive layer 105 and the socket 150.

However, because the substrate temperature adjusting-fixing device 100 is used under various ambient temperatures (e.g., from ordinary temperature to a higher temperature), thermal stress may be applied to the adhesive layer 105 and the insulating layer 160 so that the adhesive layer 105 and the insulating layer 160 push up the base body 102 provided on an upper side of the adhesive layer 105 and the insulating layer 160 in the direction of an arrow in FIG. 1. As a result, the surface shape of the base body 102 may be deformed to prevent the substrate from being sufficiently in contact with the base body 102. If the substrate is not sufficiently in contact with the base body 102, temperature distribution of the substrate is degraded to thereby possibly cause a problem in an etching rate or the like.

The above problem may not be solved by adjusting the materials of the adhesive layer 105 and the insulating layer 160. This problem becomes more conspicuous as the total thicknesses of the adhesive layer 105 and the insulating layer 160 formed on the side of the socket 150 relative to the base body 102 increases. With the example of FIG. 1, the thickness of the adhesive layer 105 formed on the side of the socket 150 relative to the base body 102 is, for example, about 50 to 100 µm. Further, the thickness of the insulating layer 160 is, for example, about 12 mm.

Figure 2:
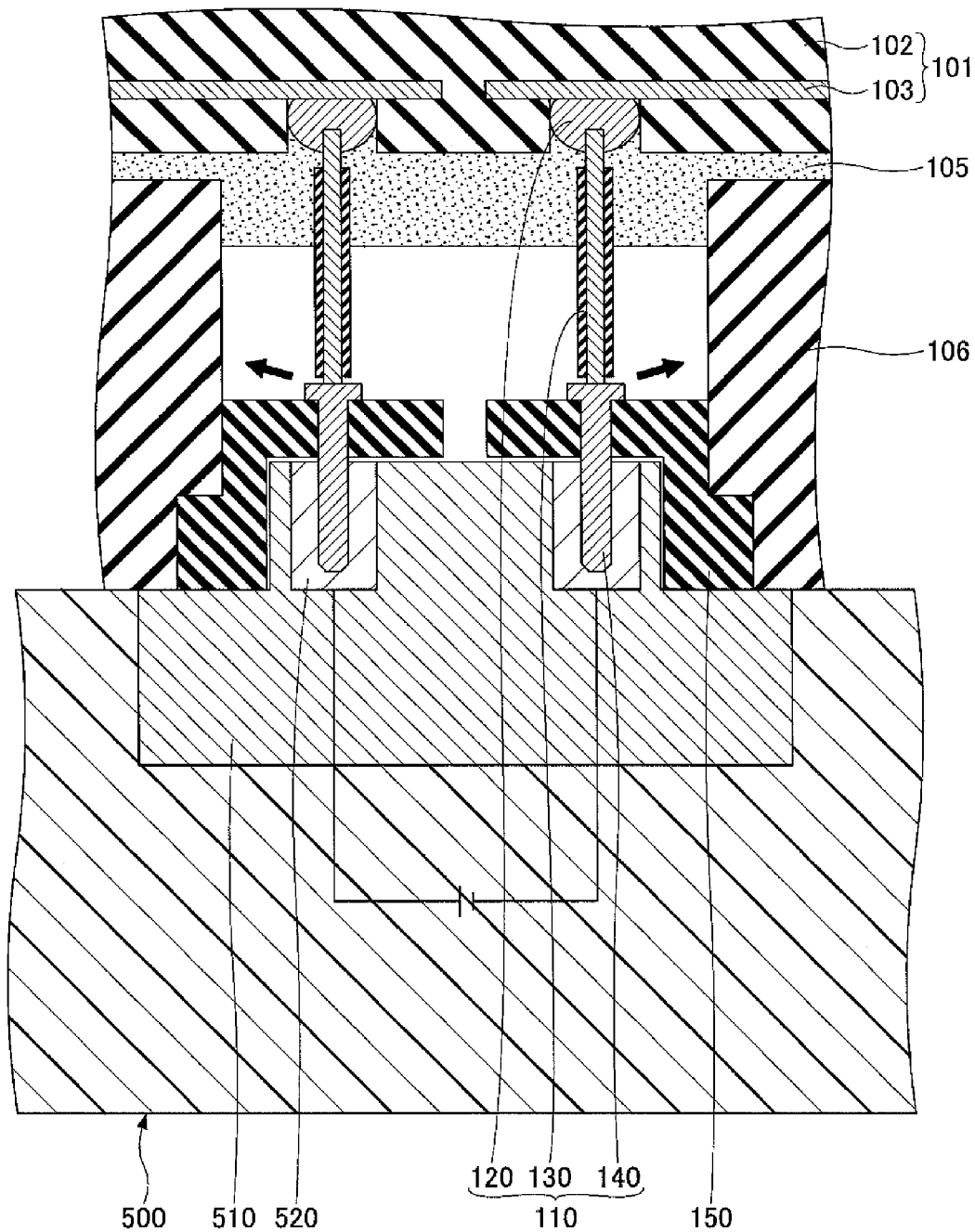
FIG. 2 is a cross-sectional view of a power supplying portion of another exemplary substrate temperature adjusting-fixing device.

In order to solve the above problem, the insulating layer 160 may be removed and a space may be provided instead of the insulating layer as in a substrate temperature adjusting-fixing device 100A illustrated in FIG. 2. With this, an insulating resin formed on the side of the socket 150 of the base body 102 may be used only for the adhesive layer 105. Therefore, the total thickness of the insulating resin becomes substantially less than that in FIG. 1. As a result, the thermal stress generated in the adhesive layer 105 can be relaxed. Thus, the above problem can be solved. However, since a high voltage (e.g., 3000 V) may be applied to the substrate temperature adjusting-fixing device 100A, there may occur another problem that electric discharge is generated between the electrode pins 140 and the base plate 106 as indicated by arrows. This problem may not be solved even if an alumite layer (a hard insulating layer) or the like is formed on the surface of the base plate 106.

[a] First Embodiment

The whole picture of the substrate temperature adjusting-fixing device of the first embodiment is described next. Thereafter, the power supplying portion of the substrate temperature adjusting-fixing device of the first embodiment is described.

Figure 3:
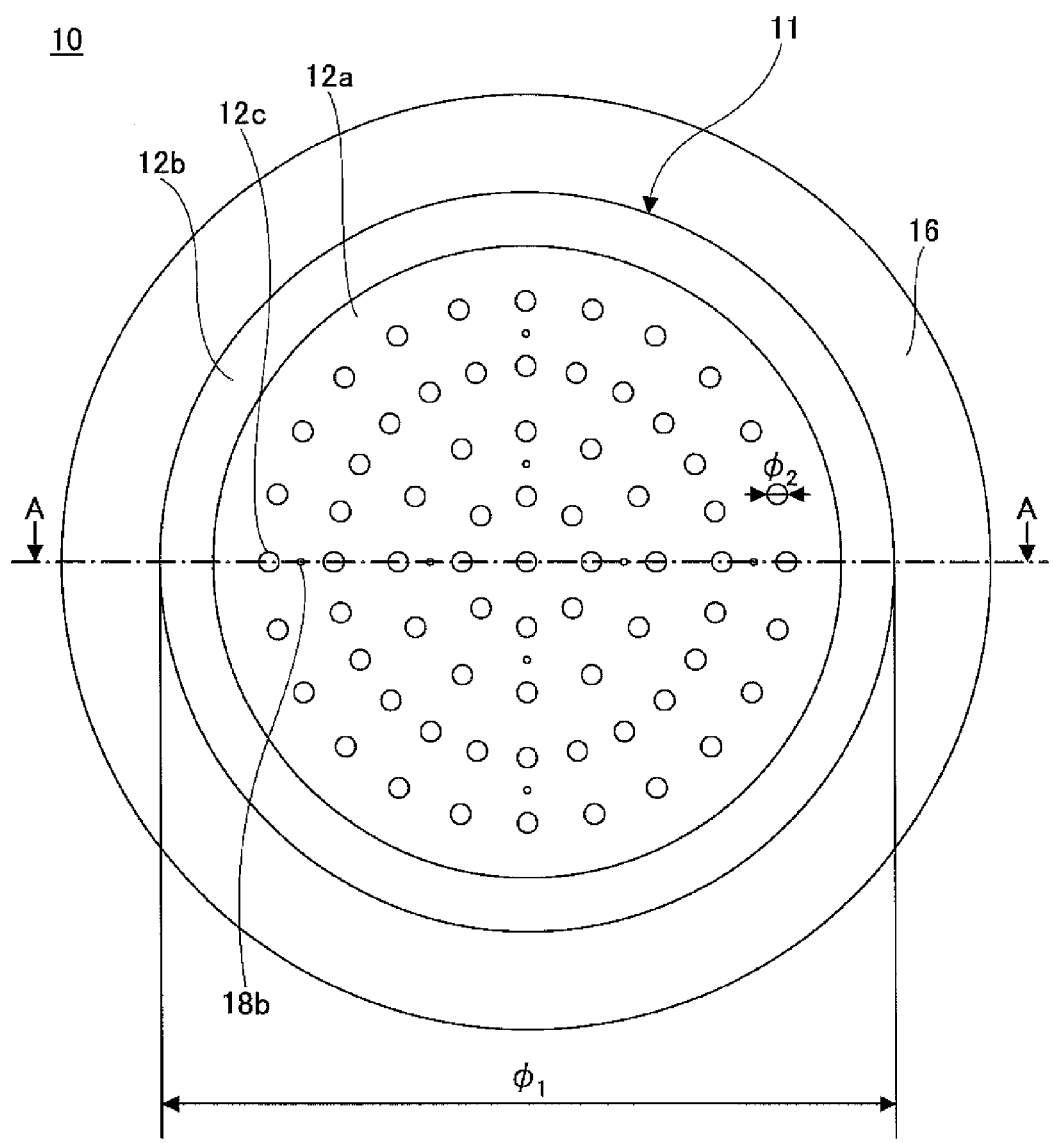
FIG. 3 is a plan view of an exemplary substrate temperature adjusting-fixing device of a first embodiment.
Figure 4:
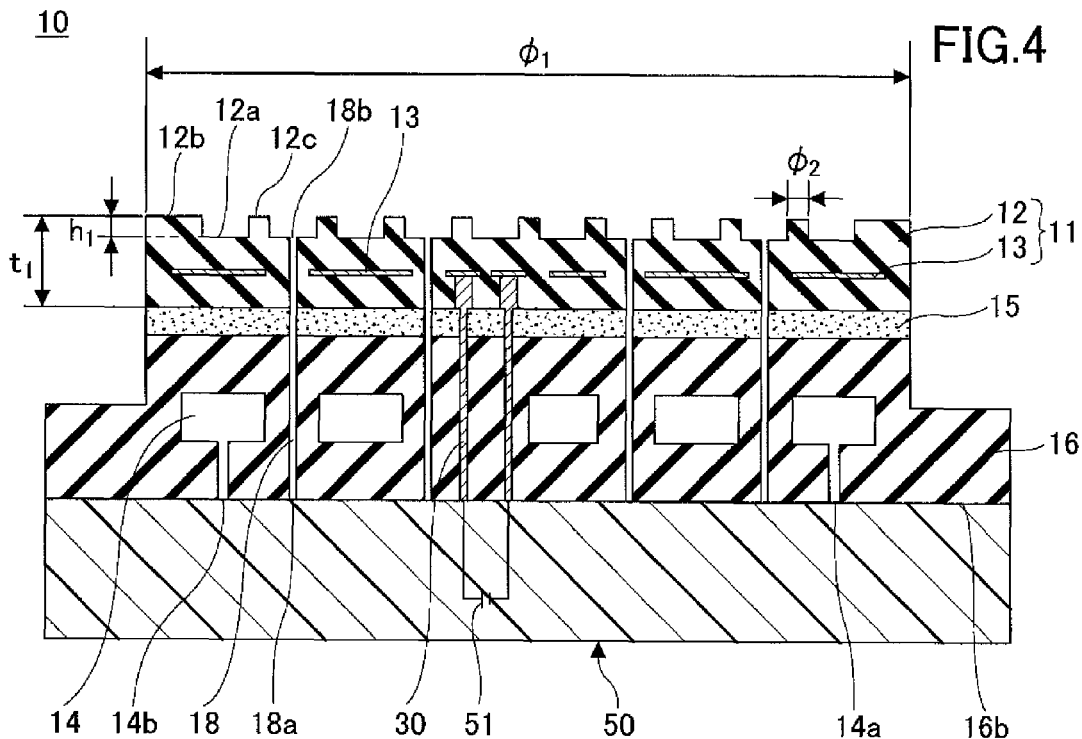
FIG. 4 is a cross-sectional view of the exemplary substrate temperature adjusting-fixing device of the first embodiment taken along a line A-A in FIG. 3.
Figure 6:
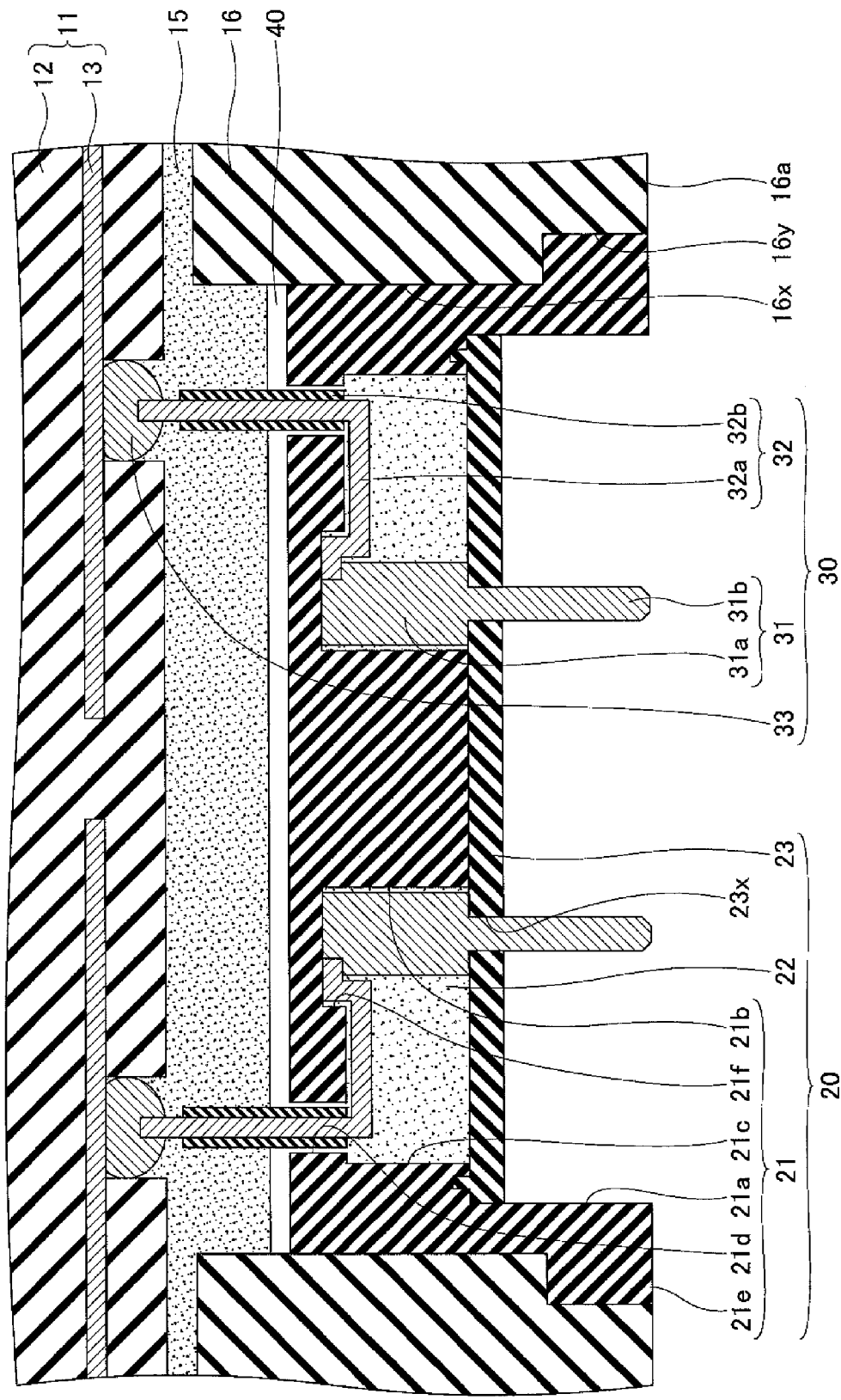
FIG. 6 is a cross-sectional view of a portion of a power supplying portion of the exemplary substrate temperature adjusting-fixing device of the first embodiment.
Figure 7:
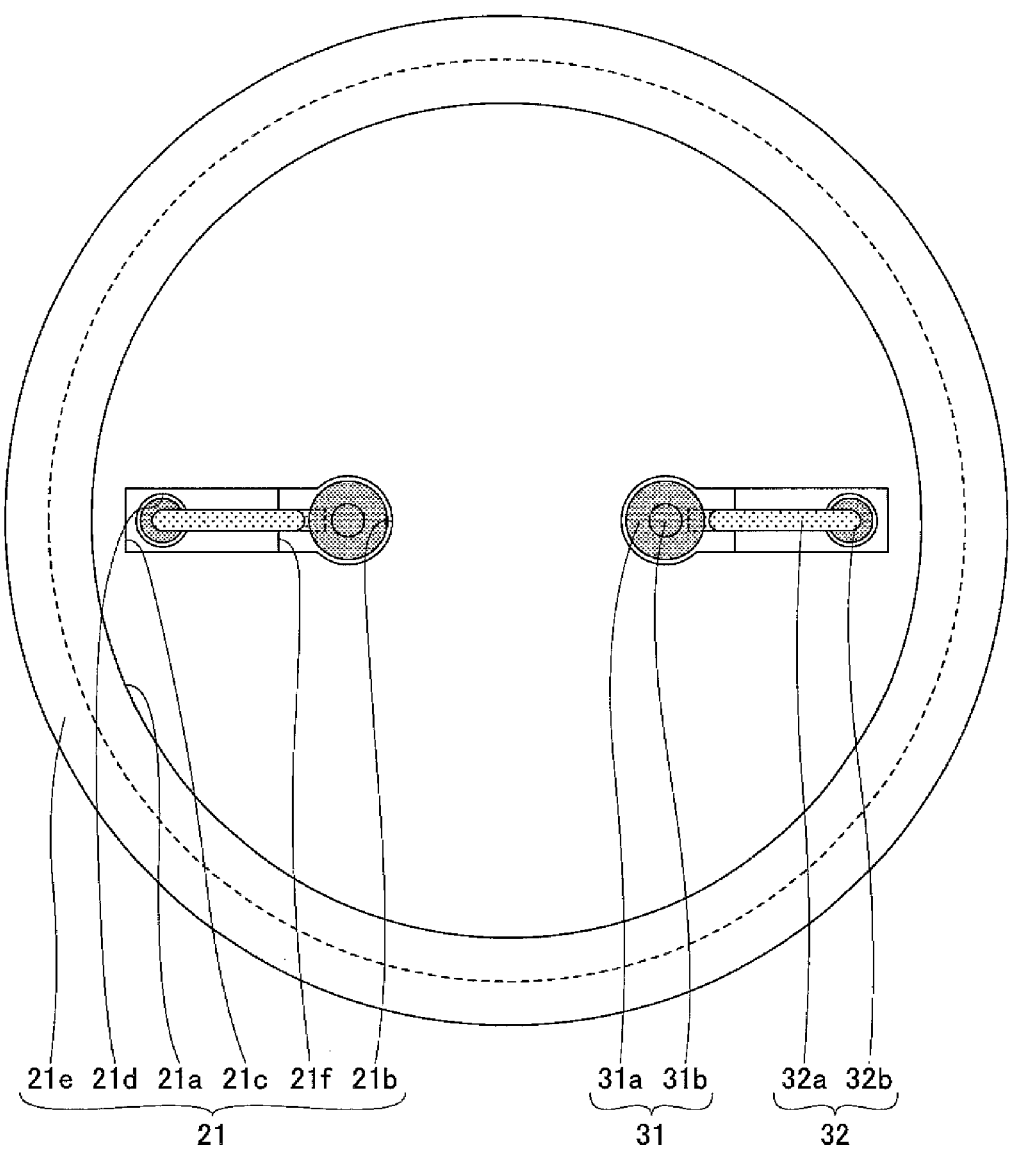
FIG. 7 is a bottom view of a portion of the power supplying portion of the exemplary substrate temperature adjusting-fixing device of the first embodiment.

FIG. 3 is a plan view of an exemplary substrate temperature adjusting-fixing device of the first embodiment. FIG. 4 is a cross-sectional view of the exemplary substrate temperature adjusting-fixing device of the first embodiment taken along a line A-A in FIG. 3. Referring to FIG. 3 and FIG. 4, a substrate temperature adjusting-fixing device 10 includes an electro static chuck 11, an adhesive layer 15 and a base plate 16. A retaining portion 20 illustrated in FIG. 6 and FIG. 7 is not illustrated in FIG. 4. A power supplying portion 30 illustrated in FIG. 6 and FIG. 7 is simplified in FIG. 4.

The electro static chuck 11 is of a coulomb force type including a base body 12 and electrodes 13. The base body 12 is a dielectric body. The base body 12 is fixed onto the base plate 16 via the adhesive layer 15. The base body 12 is made of ceramics such as $Al_2O_3$ and AlN.

The thickness $t_1$ of the base body 12 is, for example, about 1 to 20 mm. The diameter $\phi_1$ is, for example, 6 inches, 8 inches, 12 inches or the like. The relative permittivity (1 kHz) of the base body 12 is, for example, 9 to 10. The volume resistivity of the base body 12 is, for example, about $10^{12}$ to $10^{16}$.

Referring to FIG. 4, a reference symbol 12a designates an upper surface of the base body 12. An outer peripheral sealing ring 12b protruding like a circular ring in the viewing direction of the plan view, where the ring is provided on an outer periphery of the upper surface 12a of the base body 12. Inside the outer peripheral sealing ring 12b, many protrusions 12c in a circular cylindrical shape are provided so as to be sprinkled like a polka-dot pattern in its plan view. The upper surface of the outer peripheral sealing ring 12b and the upper surfaces of the protrusions 12c are substantially the same. As described, by providing many protrusions on the upper surface 12a of the base body 12, it is possible to reduce particles from attaching to the back side of the attractable object.

The heights of the upper surfaces of the protrusions 12c are substantially the same. The heights $h_1$ may be about 5 to 30 µm. The diameters $\phi 2$ of the upper surfaces of the protrusions 12c are, for example, about 0.1 to 2.0 mm. The shape of the protrusions 12c may be other than the circular cylindrical shape (the circle in its plan view). For example, an ellipse in the plan view, a polygon such as a hexagon in the plan view, a combination of plural columns having different diameters, and combinations of the above shapes may be adopted. Hereinafter, the above shapes are called "polka-dot pattern in the plan view" even if the shape is not the circular cylindrical shape (the circle in the plan view).

The electrodes 13 are in a shape of a thin film and are built in the base body 12. The electrode 13 is connected to a direct current power source 51 inside a manufacturing apparatus 50 which is provided outside the substrate temperature adjusting-fixing device 10 via a power supplying portion 30. If the predetermined voltage is applied to the electrodes 13 from the direct current source 51 via the power supplying portion 30, the coulomb force is generated between the electrodes 13 and an object to be attracted (hereinafter, an attractable object) (not illustrated) such as a substrate. Then, the attractable object (not illustrated) can be attracted and held on the upper surfaces of the outer peripheral sealing ring 12b and the protrusions 12c. The attracting and holding force becomes stronger as the voltage applied to the electrodes 13 becomes higher. The electrode 13 may be in a monopolar shape or a bipolar shape. The material of the electrodes 13 may be tungsten, molybdenum, or the like.

The adhesive layer 15 is provided to fix the base body 12 onto the base plate 16. The adhesive layer 15 may be a silicone resin having good plasticity and heat conductivity.

The base plate 16 supports the electro static chuck 11. The material of the base plate 16 may be aluminum (Al). If the base plate 16 is made of Al, an alumite layer (a hard insulating layer) may be formed on the surface of the base plate 16. The base plate 16 includes a heat generator (not illustrated) and a water path 14 to thereby control the temperature of the base body 12. The heat generator (not illustrated) generates heat by being applied a voltage to thereby heat the base body 12 via the adhesive layer 15.

The water path 14 includes a cooling water introducing portion 14a and a cooling water discharging portion 14b, which are formed on a lower surface 16b of the base plate 16. The cooling water introducing portion 14a and the cooling water discharging portion 14b are connected to a cooling water control device (not illustrated) provided outside the substrate temperature adjusting-fixing device 10. The cooling water control device (not illustrated) introduces the cooling water from the cooling water introducing portion 14a to the water path 14 and discharges the cooling water from the cooling water discharging portion 14b. By cooling the base plate 16 while circulating the cooling water, the base body 12 is cooled via the adhesive layer 15.

A gas path 18 is formed to penetrate the base body 12, the adhesive layer 15, and the base plate 16. The gas path 18 includes plural gas introducing portions 18a formed on the lower surface 16b of the base plate 16 and plural gas discharge portions 18b formed on the upper surface 12a of the base body 12. The plural gas introducing portions 18a are connected to a gas pressure control device provided outside the substrate temperature adjusting-fixing device 10. The gas pressure control device (not illustrated) makes the pressure of an inert gas vary in a range of 0 to 50 Torr to thereby introduce the inert gas from the gas introducing portion 18a into the gas path 18.

Figure 5:
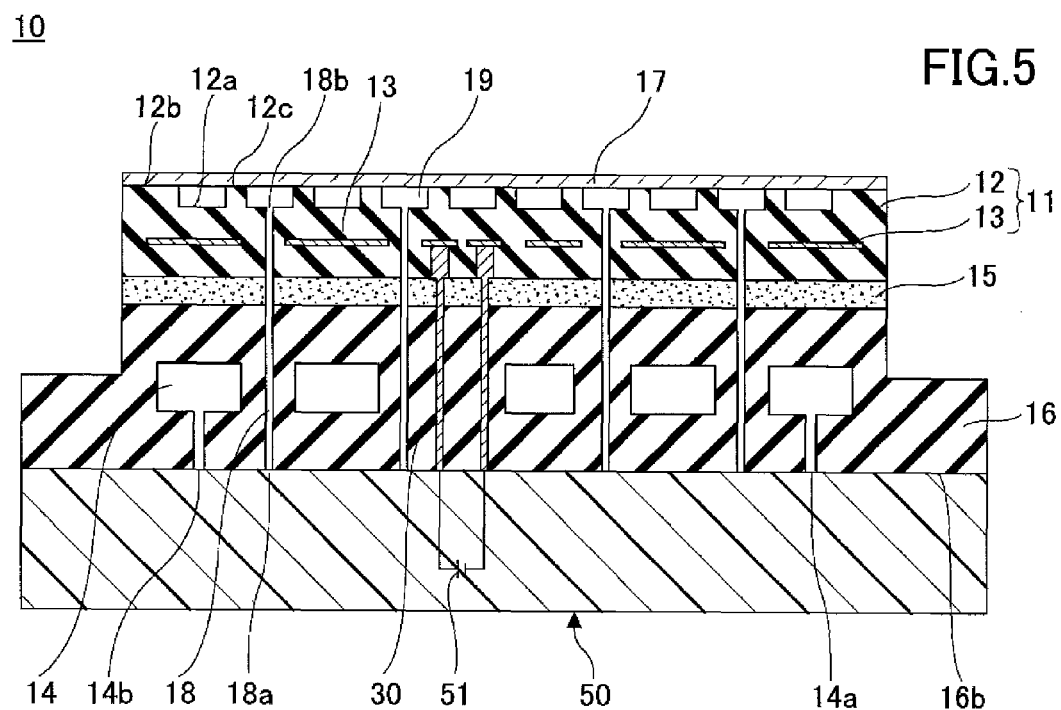
FIG. 5 is a cross-sectional view of the exemplary substrate temperature adjusting-fixing device which attracts and holds a substrate in the first embodiment.

FIG. 5 is a cross-sectional view of an exemplary substrate temperature adjusting-fixing device which attracts and holds a substrate in the first embodiment. The power supplying portion 30 illustrated in FIG. 6 and FIG. 7 is simplified in FIG. 5. Referring to FIG. 5, the reference symbol 17 designates a substrate as an attractable object, and the reference symbol 19 designates gas charging portions which are filled with the inert gas. Referring to FIG. 5, the substrate 17 is attracted and held on the upper surfaces of the outer peripheral sealing ring 12b and the protrusions 12c.

The temperature of the substrate 17 is controlled by the heat generator (not illustrated) and the water path 14. The substrate 17 is, for example, a silicon wafer. The thickness of the substrate 17 is, for example, 700 μm through 1000 μm. By selecting the shapes and the dimensions of the protrusions 12c, it is possible to apply the substrate temperature adjusting-fixing device of the first embodiment to a substrate having the thickness different from the above substrate.

The gas pressure control device (not illustrated) introduces the inert gas from the plural gas introducing portions 18a to the gas paths 18. The introduced inert gas is discharged from the gas discharge portions 18b and enters inside the gas charging portions 19 formed between the lower surface of the substrate 17 and the upper surface 12a of the base body 12. Thus, heat conductivity between the base body 12 and the substrate 17 is improved. The inert gas is, for example, He, Ar or the like.

FIG. 6 is a cross-sectional view of a portion of a power supplying portion of the exemplary substrate temperature adjusting-fixing device 10 of the first embodiment. Referring to FIG. 6, the connector 510 illustrated in FIG. 1 is omitted. FIG. 7 is a bottom view of a portion of the power supplying portion of the exemplary substrate temperature adjusting-fixing device 10 of the first embodiment. Referring to FIG. 7, the retaining portion 20 and the power supplying portion 30 are partly illustrated, and the base plate 16, a sealing portion 22 and a lid portion 23 are not illustrated. For the sake of convenience, parts of the portions illustrated in FIG. 7 are hatched like pearskin finish (hatched by dots).

Referring to FIG. 6 and FIG. 7, the substrate temperature adjusting-fixing device 10 includes the retaining portion 20 in addition to the electro static chuck 11 or the like illustrated in FIG. 3. The power supplying portions 30 simplified in FIG. 4 and FIG. 5 are described in detail.

The retaining portion 20 includes a socket 21, the sealing portion 22 and the lid portion 23. The retaining portion 20 holds the power supplying portion 30 with, for example, the sealing portion 22. The power supplying portion 30 is connected to the direct current power source (referring to the direct current power source 51 illustrated in FIG. 4 or the like) provided outside the substrate temperature adjusting-fixing device 10. The power supplying portion 30 includes two electrode pins 31, two electric wires 32 and two connecting portions 33. A predetermined voltage is applied to the electrode 13 from the direct current power source provided outside the substrate temperature adjusting-fixing device 10 (see the direct current power source 51) via the power supplying portion 30 to the electrode 13. The reference symbol 40 designates a space portion (hereinafter referred to as a "space portion 40") provided between the lower surface of the adhesive layer 15 and the upper surface of the socket 21. The socket 21 is a typical example of the retaining portion of the first embodiment.

The socket 21 is fixed to an inner wall of a through hole 16x penetrating the base plate 16 in its thickness direction by, for example, bonding, press fit or the like. The socket 21 may be inserted into the through hole 16x, and a fixing pin (not illustrated) may be inserted from an insertion hole (not illustrated) formed in the base plate 16 into a recess (not illustrated) provided in an outer peripheral portion of the socket 21.

The socket 21 has a recess 21a opening on a side opposite to the side of the adhesive layer 15. The socket 21 further includes, inside the recess 21a, two recesses 21b opening on a side opposite to the side of the adhesive layer 15, two recesses 21c adjacent to side walls (borders between the recesses 21b and the recesses 21c) of the recesses 21b at one end of the two recesses 21c, two through holes 21d penetrating from the sides of the ends opposite to the one of ends of the recesses 21c, and protrusions 21e provided at lower portions on the outer side surfaces. Step portions 21f are provided between the recesses 21b and the recesses 21c. The depths (the lengths in the thickness direction) of the recesses 21b are greater than the depths (the lengths in the thickness direction) of the recesses 21c. The protrusions 21e are engaged with recesses 16y arranged in lower portions of the through hole 16x.

The lid portion 23 is fixed to the inner wall of the recess 21a so as to enclose a fixing portion 31a of the electrode pin 31 (to be described later) and the sealing portion 22 by, for example, bonding, press fit, screw clamp, or the like. For example, the lid portion 23 may be shaped to have a positioning protrusion, which is engaged with a positioning recess provided in the socket 21. The material of the socket 21 and the lid portion 23 is an insulating material such as polyimide. Since the fixing portion 31a of the electrode pin 31 is fixed to the sealing portion 22, it is not always necessary to provide the lid portion 23.

The plan view of the recess 21a may be a circle having a diameter of about 20 mm. The plan view of the recess 21b may be a circle having a diameter of about 3 mm. The plan view of the recess 21c is rectangular having a width of about 2 mm and a length of about 5 mm. For example, the protrusion 21e protrudes like a circular ring on the outer side surface in a lower portion of the socket 21. The amount of the protrusion is about 5 mm from the outer side surface of the socket 21.

The electrode pin 31 includes the fixing portion 31a and a protruding portion 31b protruding along the longitudinal direction of the fixing portion 31a of the electrode pin 31 from the fixing portion 31a. The fixing portion 31a is inserted inside the recess 21b of the socket 21. The fixing portion 31a is shaped like a cylindrical column, and the protruding portion 31b is shaped like a cylindrical column having the diameter smaller than that of the fixing portion 31a. The fixing portion 31a and the protruding portion 31b are coaxial. The protruding portion 31b protrudes on a lower side (the side opposite to the side of the adhesive layer 15) of the lid portion 23 from a through hole 23x of the lid portion 23. The diameter of the fixing portion 31a may be about 2.9 mm. The diameter of the protruding portion 31b may be about 2.0 mm. The length of the electrode pin 31 (the fixing portion 31a and the protruding portion 31b) is, for example, about 10 mm. The material of the electrode pin 31 may be a conductive material such as copper. By providing the step portion 21f, it is possible to easily position the fixing portion 31a and hold the fixing portion 31a.

The electric wires 32 are wired inside the adhesive layer 15, the through holes 21d, the space portion 40 and the recesses 21c. The electric wire 32 includes a conductive portion 32a and a coating portion 32b coating the periphery of the conductive portion 32a. An end of the conductive portion 32a is joined to the electrode 13 via the connecting portion 33. The other end of the conductive portion 32a is joined to the fixing portion 31a of the electrode pin 31. Said differently, the electrode 13 and the electrode pin 31 are electrically connected via the electric wire 32.

The other end of the conductive portion 32a and the fixing portion 31a of the electrode pin 31 may be joined by using a conductive material such as solder and conductive resin paste (e.g., Ag paste). However, without using the conductive material, caulking may be used to join the other end of the conductive portion 32a to the fixing portion 31a of the electrode pin 31. The portion of the conductive portion 32a or the electric wire 32 wired inside at least the through hole 21d and the space portion 40 are not exposed from the coating portion 32b. This is to prevent electric discharge from the electric wire 32 to the base plate 16.

The material of the conductive portion 32a may be a conductive material such as copper. The material of the coating portion 32b is, for example, an insulating material such as polyethylene. The material of the connecting portion 33 is a conductive material such as solder and conductive resin paste such as an Ag paste. When the material of the connecting portion 33 is solder, the solder may be, for example, an alloy containing Pb, an alloy containing Sn and Cu, an alloy containing Sn and Ag, an alloy containing Sn, Ag, and Cu, and so on.

The sealing portion 22 holds the electrode pin 31 and fills inside the recess 21b and the recess 21c so that the electric wire 32 is not exposed from the recess 21c. The material of the sealing portion 22 is, for example, an insulating resin such as epoxy resin. Although the socket 21 is made of an insulating material, if the sealing portion 22 is not provided, electric discharge may be generated between the conductive portion 32a and the base plate 16. By providing the sealing portion 22, a risk of generating the electric discharge between the conductive portion 32a and the base plate 16 can be prevented. In order to further ensure a countermeasure against the electric discharge, it is preferable to coat the periphery of the conductive portion 32a which is wired inside the recess 21c with the coating portion 32b.

Referring to FIG. 6, the space portion 40 is provided between the lower surface of the adhesive layer 15 and the upper surface of the socket 21. However, the space portion 40 may not be provided. By providing the space portion 40, even when the thickness of the adhesive layer 15 on the socket 21 is unstable, it is possible to easily insert the socket 21 inside the through hole 16x. The space portion 40 is, for example, several mm.

The thickness of a part of the adhesive layer 15 which does not correspond to the through hole 16x, namely a part in contact with the upper surface of the base plate 16, may be, for example, about 0.1 to 0.5 mm. The thickness of a part of the adhesive layer 15 corresponding to the upper surface of the socket 21 via the space portion 40, namely the thickness of the adhesive layer 15 inside the through hole 16x, may be greater than the thickness of the part of the adhesive layer 15 which does not correspond to the through hole 16x.

A method of assembling the socket 21 or the like is described next. FIG. 8 to FIG. 11 illustrate an assembling method of the socket 21 and so on in a substrate temperature adjusting-fixing device. In FIG. 8 to FIG. 11, the vertical position of the substrate temperature adjusting-fixing device in FIG. 6 is upside-down.

Figure 8:
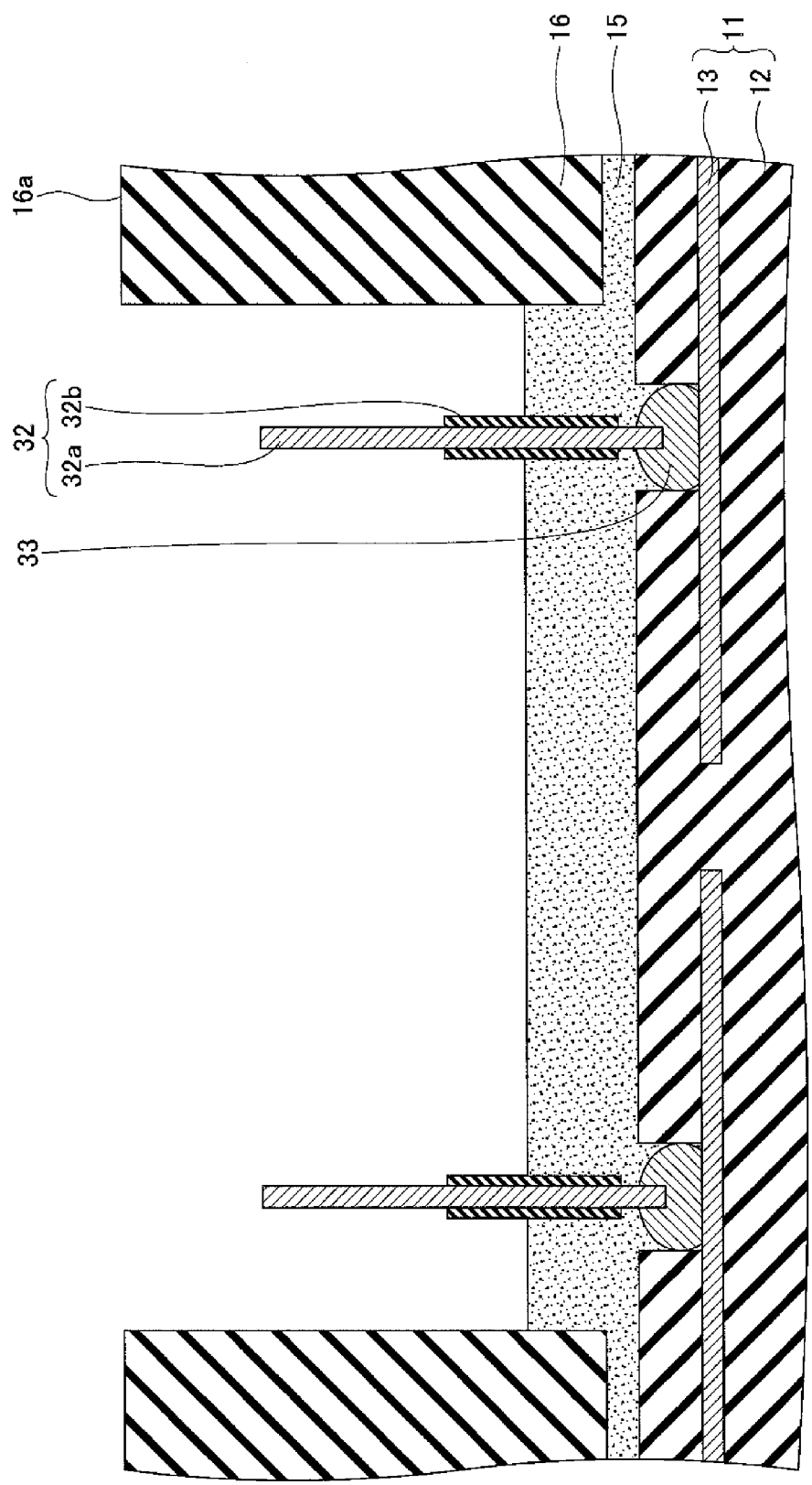
FIG. 8 illustrates an assembling method of a socket.

Referring to FIG. 8, the one ends of conductive portions 32a of the two electric wires 32 are joined to the electrodes 13 via the connecting portions 33. The base body 12 is joined to the base plate 16 via the adhesive layer 15, and the ends of the conductive portions 32a and the connecting portions 33 are covered by the adhesive layer 15.

Figure 9:
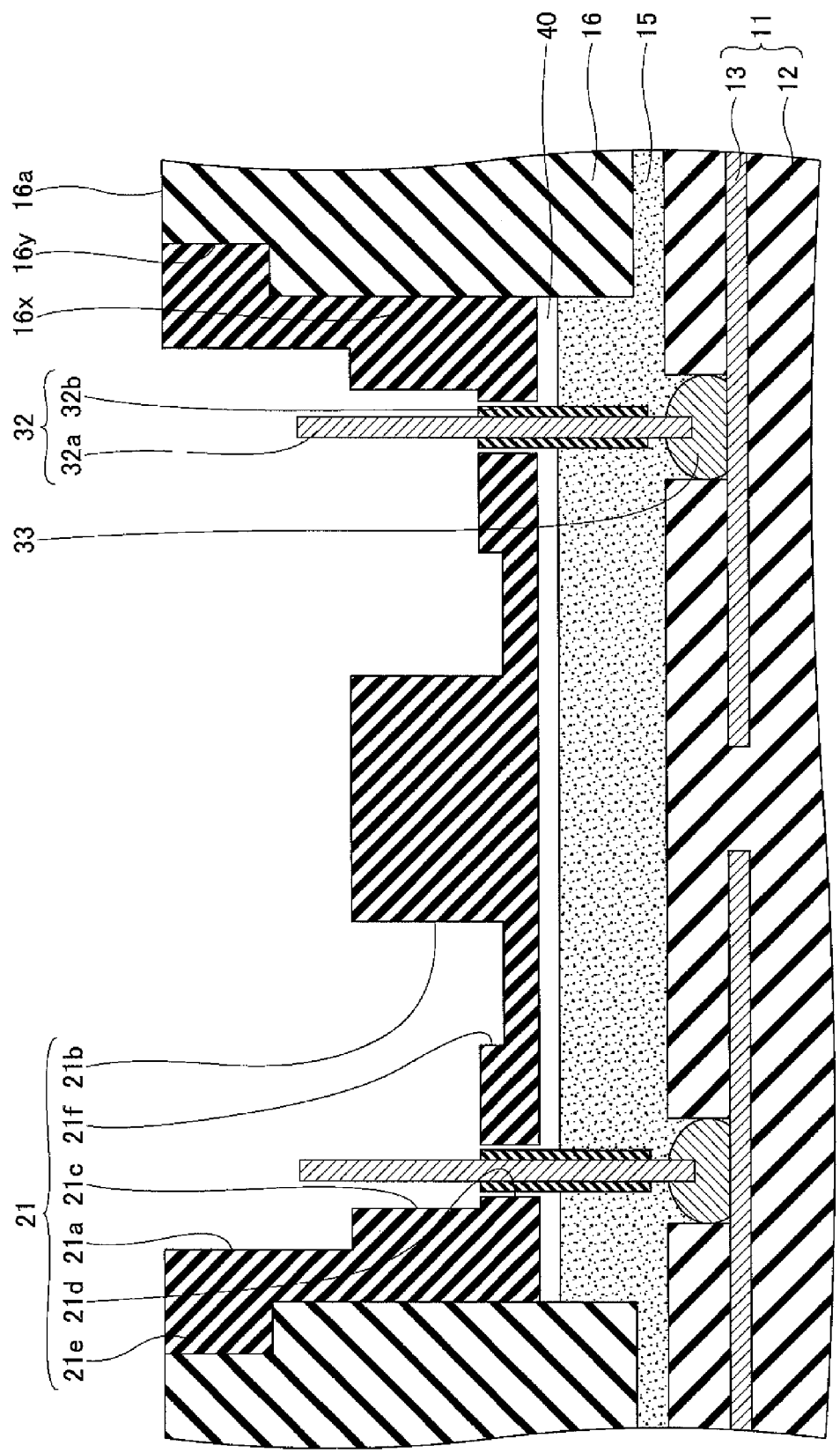
FIG. 9 illustrates the assembling method of the socket.

Next, as illustrated in FIG. 9, the electric wires 32 are inserted into the through holes 21d of the sockets 21 via the space portion 40, the sockets 21 are inserted into the through hole 16x, and the protrusions 21e of the sockets 21 are engaged with recess 16y of the through hole 16x. The socket 21 is fixed to the base plate 16 by, for example, bonding, press fit or the like. The fixing pin (not illustrated) may be inserted into the recess (not illustrated) formed on the outer peripheral portion of the socket 21 from the insertion hole (not illustrated) formed on the base plate 16. The part of the electric wire 32 inserted into the through hole 21d is always covered by the coating portion 32b so that conductive portion 32a is coated by the coating portion 32b.

Figure 10:
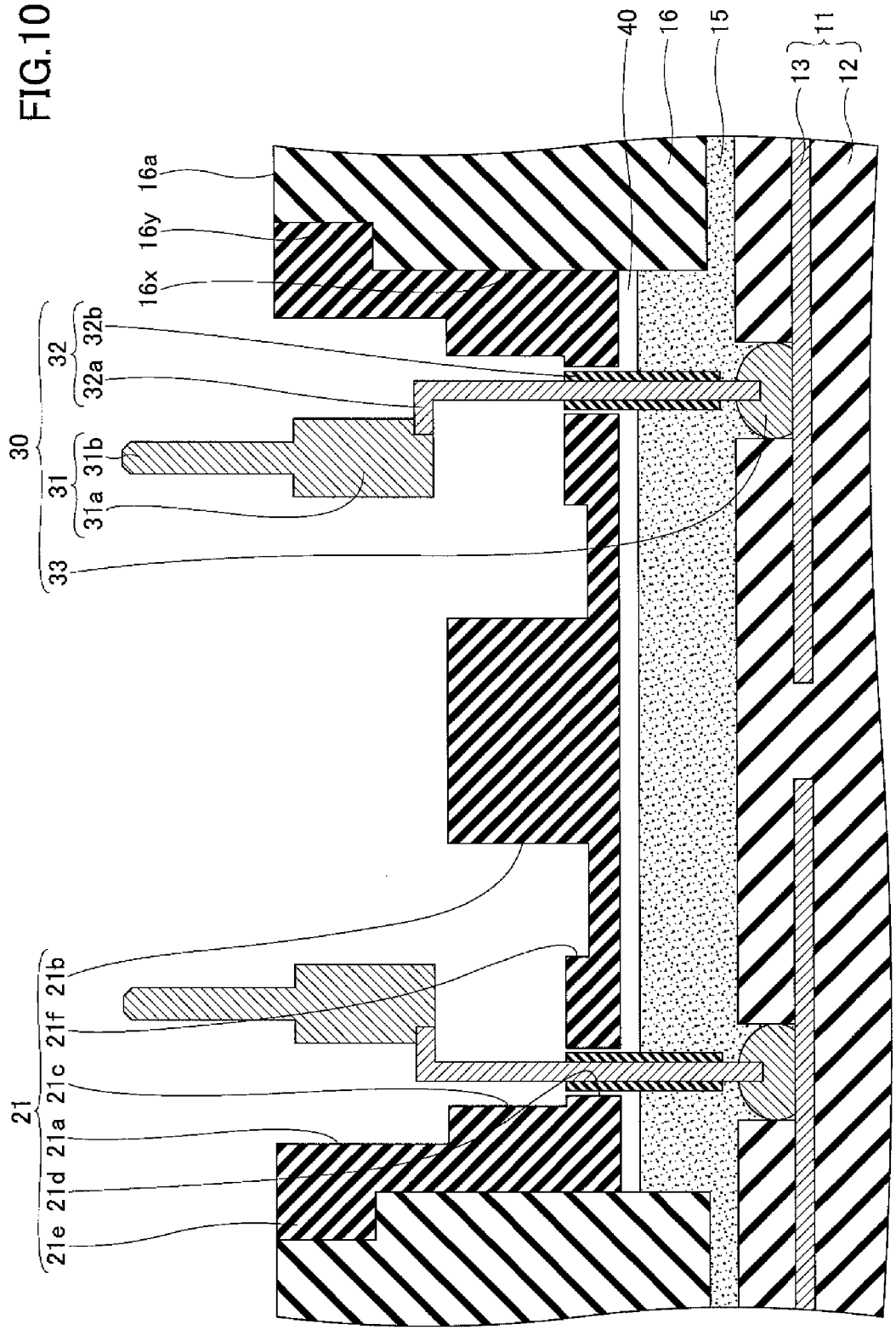
FIG. 10 illustrates the assembling method of the socket.

Next, referring to FIG. 10, the other ends of the conductive portions 32a are joined to the fixing portions 31a of the electrode pins 31. The other end of the conductive portion 32a and the fixing portion 31a of the electrode pin 31 may be joined by using a conductive material such as solder and conductive resin paste (e.g., Ag paste). However, without using the conductive material, caulking may be used to join the other end of the conductive portion 32a to the fixing portion 31a of the electrode pin 31.

Figure 11:
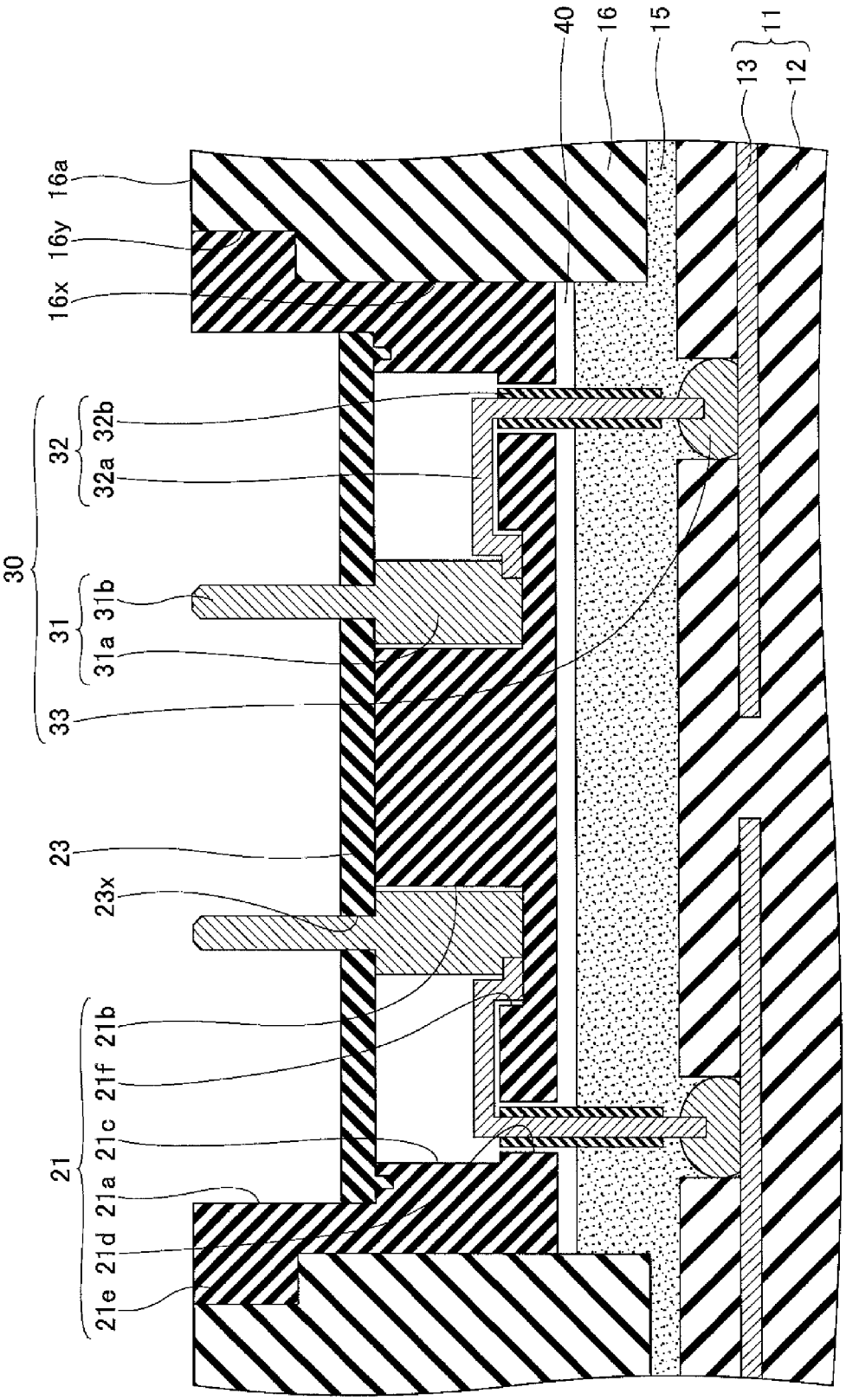
FIG. 11 illustrates the assembling method of the socket.

Referring to FIG. 11, the electric wire 32 is properly shaped (bent) so as to insert the electric wire 32 inside the recess 21c. Thus, the fixing portions 31a of the electrode pins 31 are inserted into the recesses 21b and provisionally fixed to the recesses 21b. The protruding portions 31b of the electrode pins 31 are inserted inside the through holes 23x of the lid portion 23. Then, the lid portion 23 is fixed to the inside of the recess 21a by, for example, bonding, press fit and screw clamp. For example, the lid portion 23 may be engaged with a recess formed on the side of the socket 21 by a positioning protrusion provided in the lid portion 23.

Referring to FIG. 11, a potting machine (not illustrated) is used to inject an insulating resin such as an epoxy resin from a resin injection hole (not illustrated) formed in the lid portion 23 to the insides of the recess 21b and the recesses 21c to thereby fill the insides of the recess 21b and the recesses 21c with the insulating resin. The insulating resin inside the recesses 21b and the recesses 21c is cured by applying heat thereby forming the sealing portion 22. Meanwhile, the sealing portion 22 may be formed inside the through holes 21d.

As described, with the substrate temperature adjusting-fixing device 10 of the first embodiment, the electrode pins 31 are inserted into the recesses 21b of the socket 21 from the side opposite to the adhesive layer 15 so as not to be exposed on the side of the adhesive layer 15. The electric wires 32 of which conductive portions 32a are coated by the coating portions 32b are inserted inside the through holes 21d of the sockets 21. The conductive portions 32a are exposed from the coating portions 32b inside the recesses 21c. Further, the fixing portions 31a of the electrode pins 31 and the electric wires 32 inside the recesses 21c are sealed by the sealing portion 22 made of the insulating material. With this structure, the insulating resin formed on the side of the socket 21 of the base body 12 may be only for the adhesive layer 15. Therefore, the total thickness of the insulating resin becomes substantially less than that of the case of FIG. 1. As a result, when the substrate temperature adjusting-fixing device 10 is used under various ambient temperatures, the thermal stress generated in the adhesive layer 15 can be reduced in comparison with the case of FIG. 1. Therefore, it is possible to prevent the surface shape of the base body 12 from deforming, and to prevent the attractable object from being insufficiently attracted and held by the base body 12. Further, since the electrode pins 31 made of the conductive material and the conductive portions 32a of the electric wires 32 are not exposed on the side of the base plate 16, it is possible to prevent electric discharge from being generated between the conductive portions 32a and the base plate 16.

Modified Example 1 of the First Embodiment

Figure 12:
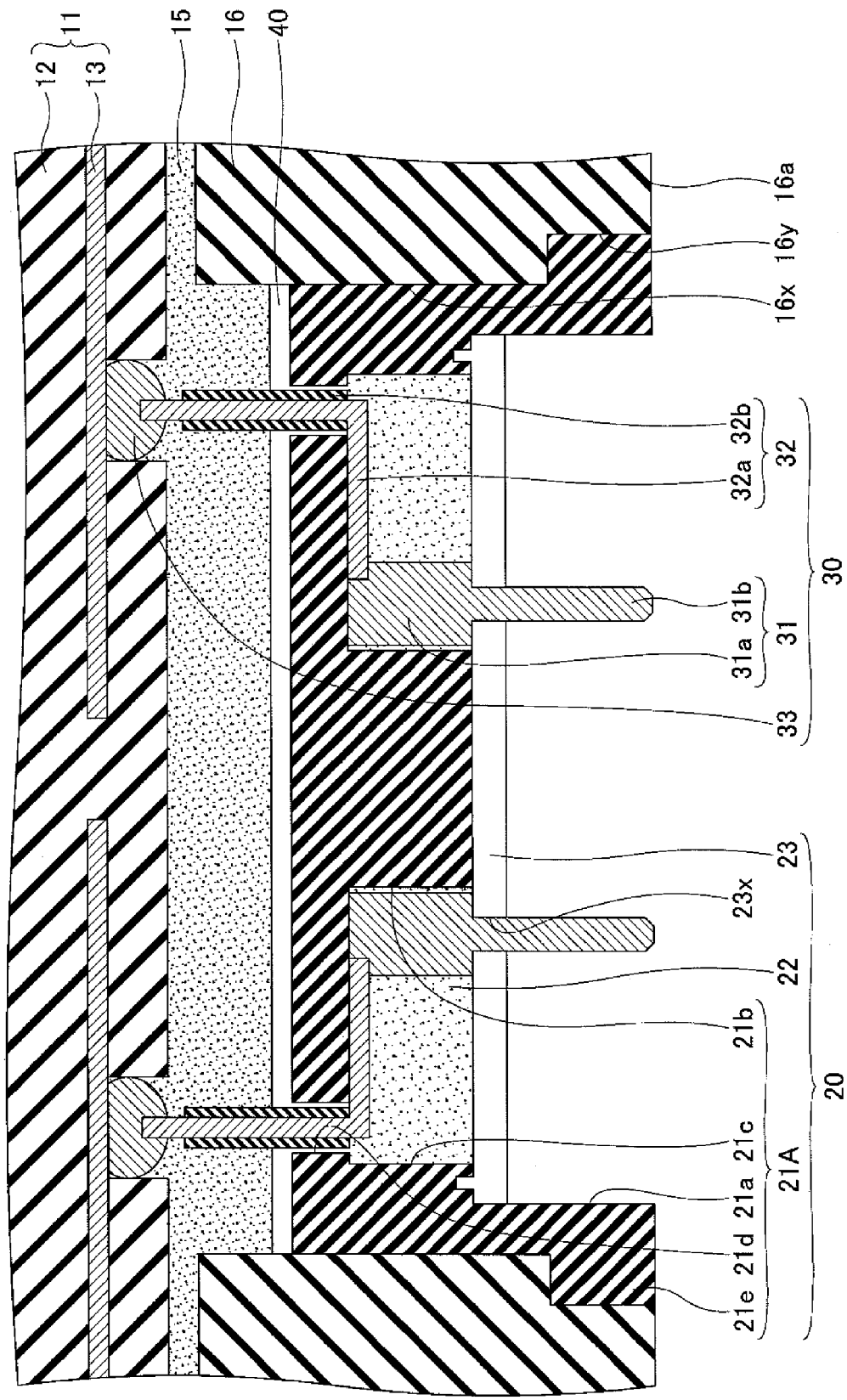
FIG. 12 is a cross-sectional view of a power supplying portion of an exemplary substrate temperature adjusting-fixing device of a modified example 1 of the first embodiment.

FIG. 12 is a cross-sectional view of a part of a power supplying portion of an exemplary substrate temperature adjusting-fixing device of a modified example 1 of the first embodiment. In the modified example 1 of the first embodiment, explanation of component parts which are the same as those described in the above description of the first embodiment is omitted.

Referring to FIG. 12, a substrate temperature adjusting-fixing device 10A differs from the substrate temperature adjusting-fixing device 10 illustrated in FIG. 6 or the like at a point that the socket 21 of the first embodiment is replaced by a socket 21A.

In the socket 21A, the step portion 21f is not provided between the recess 21b and the recess 21c unlike the socket 21. Said differently, the depth (the length in the thickness direction) of the recess 21b is substantially the same as the depth (the length in the thickness direction) of the recess 21c.

Electrode pins 31 are fixed to a sealing portion 22 and a lid portion 23, so that the depth (the length in the thickness direction) of the recess 21b can be substantially the same as the depth (the length in the thickness direction) of the recess 21c. With the modified example 1 of the first embodiment, effects similar to those of the first embodiment can be obtained.

Modified Example 2 of the First Embodiment

Figure 13:
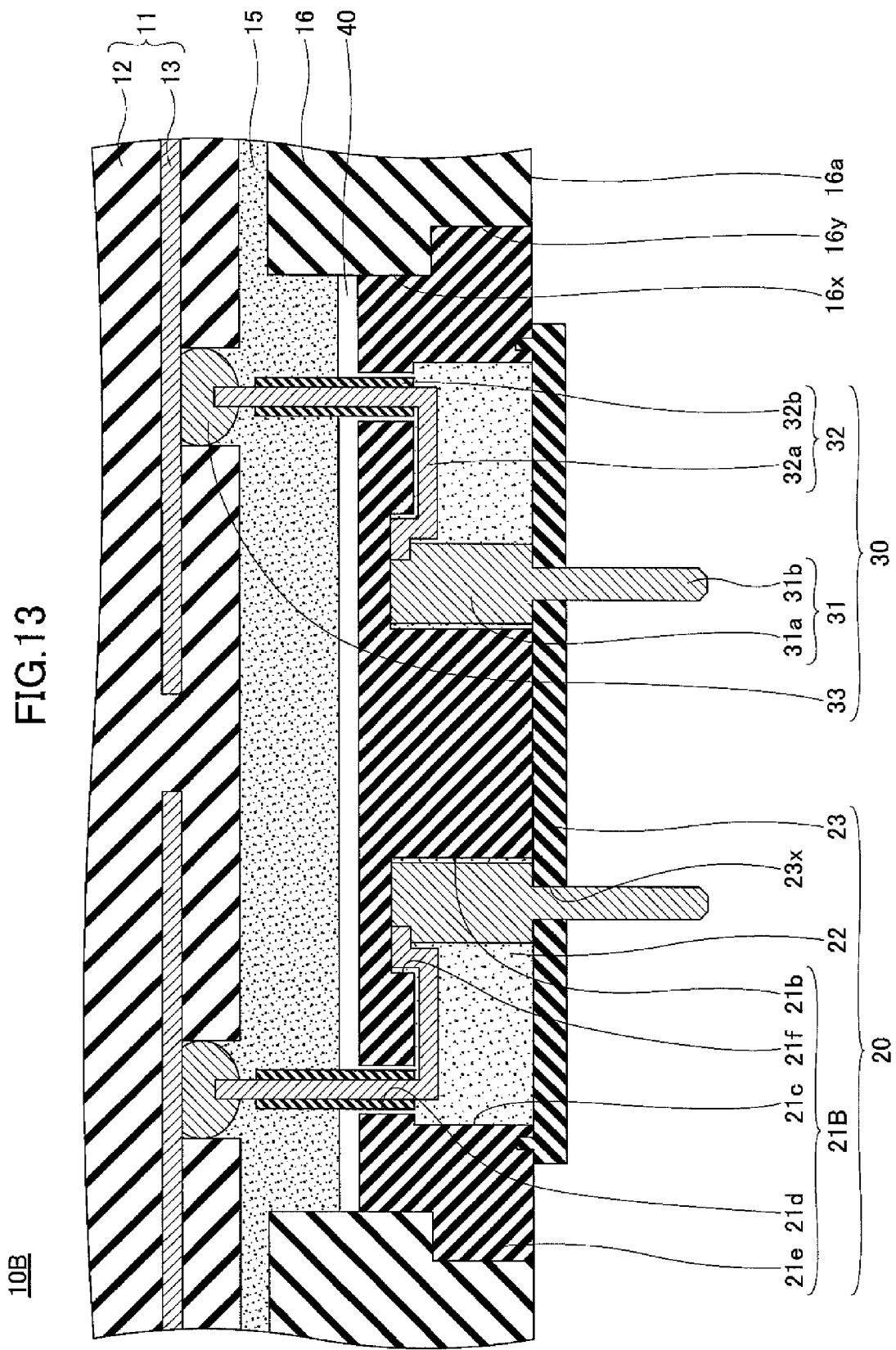
FIG. 13 is a cross-sectional view of a power supplying portion of an exemplary substrate temperature adjusting-fixing device of a modified example 2 of the first embodiment.

FIG. 13 is a cross-sectional view of a part of a power supplying portion of an exemplary substrate temperature adjusting-fixing device of a modified example 2 of the first embodiment. In the modified example 2 of the first embodiment, explanation of component parts the same as those described in the above description of the first embodiment is omitted.

Referring to FIG. 13, a substrate temperature adjusting-fixing device 10B differs from the substrate temperature adjusting-fixing device 10 illustrated in FIG. 6 or the like at a point that the socket 21 of the first embodiment is replaced by a socket 21B.

The socket 21B has no recess 21a unlike the socket 21. As described, the protruding portion 31b of the electrode pin 31 may protrude from the lower surface 16b of the base plate 16. With the modified example 2 of the first embodiment, effects similar to those of the first embodiment can be obtained.

Within the embodiment, the power supplying portion 30 can be formed at an arbitrary position in conformity with the design of the electrode 13. Further, the number of the pairs of the power supplying portions 30 may not be one and can be plural.

Although the electrode 13 is in the bipolar shape in the first embodiment and the modified examples 1 and 2, the electrode 13 may be in a monopolar shape. In this case, the numbers of the electrode pins 31, the electric wires 32 and the connecting portions 33 are one, respectively.

Within the first embodiment and the modified examples 1 and 2, the electro static chuck of a coulomb force type is exemplified. However, the first embodiment and the modified examples 1 and 2 may be similarly applicable to an electro static chuck of a Johnsen-Rahbek type.

Within the first embodiment and the modified examples 1 and 2, an electro static chuck having a surface shape of an emboss type (a type having many protrusions on the upper surface of the base body) is exemplified. However, the first embodiment and the modified examples 1 and 2 may be similarly applicable to an electro static chuck without having a surface shape of an emboss type.

Further, the attractable object used in the substrate temperature adjusting-fixing device of the first embodiment and the modified examples 1 and 2 may be, for example, a semiconductor wafer (e.g., a silicon wafer), a glass substrate used in a manufacturing process for a liquid crystal panel, or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A substrate temperature adjusting-fixing device comprising:
an electro static chuck configured to attract and hold an attractable object onto a base body of the electro static chuck by applying a voltage to an electrode which is built in the base body;
a base plate configured to fix the electro static chuck via an adhesive layer;
a power supplying portion electrically connected to the electrode; and
a retaining portion configured to hold the power supplying portion,
wherein the retaining portion includes a retaining portion main body and a sealing portion,
the retaining portion main body is fixed to the base plate, and has recesses opened on a side opposite to a side of the adhesive layer and a through hole penetrating through the retaining portion main body from the recesses to the side of the adhesive layer, the power supplying portion includes an electrode pin and an electric wire, the electrode pin is fixed to an inside of the recesses, the electric wire is wired inside the adhesive layer, the through hole and the recesses to electrically connect the electrode with the electrode pin, and the sealing portion is formed by filling in the recesses.

2. The substrate temperature adjusting-fixing device according to claim 1, wherein the electrode pin includes a fixing portion and a protruding portion protruding from the fixing portion, the retaining portion further includes a lid portion having an electrode through hole enabling the protruding portion to protrude from the lid portion onto the side opposite to the side of the adhesive layer, and the lid portion is fixed to a side of the retaining portion main body opposite to the side of the adhesive layer so as to enclose the fixing portion, a part of the electric wire, and the sealing portion in the recesses.

3. The substrate temperature adjusting-fixing device according to claim 1, wherein the recesses include a first recess opened on the side of the retaining portion main body opposite to the side of the adhesive layer, and a second recess opened in parallel with the first recess on the side of the retaining portion main body opposite to the side of the adhesive layer, wherein the through hole the retaining portion penetrates from the second recess to the side of the adhesive layer, the electrode pin is fixed to the first recess, and the electric wire is wired inside the adhesive layer, the through hole, and the second recess to electrically connect the electrode with the electrode pin.

4. The substrate temperature adjusting-fixing device according to claim 3, wherein a depth of the first recess is greater than a depth of the second recess.

5. The substrate temperature adjusting-fixing device according to claim 1, further comprising:

a space portion formed between the adhesive layer and the retaining portion main body.

6. The substrate temperature adjusting-fixing device according to claim 5, wherein the electric wire includes a conductive portion and a coating portion covering a periphery of the conductive portion, and wherein the conductive portion is not exposed from the coating portion at least inside the through hole and the space portion.

* * * * *